US008564043B2

(12) United States Patent
Huang et al.

(10) Patent No.: US 8,564,043 B2
(45) Date of Patent: Oct. 22, 2013

(54) EEPROM CELL STRUCTURE AND A METHOD OF FABRICATING THE SAME

(75) Inventors: Sheng He Huang, Singapore (SG); Eng Keong Ho, Singapore (SG); Ping Yaw Peh, Singapore (SG)

(73) Assignee: Systems On Silicon Manufacturing Co. Pte. Ltd., Singapore (SG)

( * ) Notice: Subject to any disclaimer, the term of this patent is extended or adjusted under 35 U.S.C. 154(b) by 82 days.

(21) Appl. No.: 13/005,693

(22) Filed: Jan. 13, 2011

(65) Prior Publication Data

US 2012/0181594 A1  Jul. 19, 2012

(51) Int. Cl.
  *H01L 29/788*  (2006.01)
(52) U.S. Cl.
  USPC ........ 257/316; 257/314; 257/315; 257/E29.3; 257/E21.546; 438/424; 438/257; 438/594
(58) Field of Classification Search
  USPC .............. 257/314, 315, 316, E29.3, E21.545; 438/257, 424, 594
  See application file for complete search history.

(56) References Cited

U.S. PATENT DOCUMENTS

| 6,495,467 | B2 * | 12/2002 | Shin et al. | 438/706 |
| 2007/0108498 | A1 * | 5/2007 | Lee et al. | 257/315 |
| 2009/0011588 | A1 * | 1/2009 | Kim | 438/594 |

* cited by examiner

*Primary Examiner* — Long Pham
(74) *Attorney, Agent, or Firm* — Pillsbury Winthrop Shaw Pittman, LLP

(57) ABSTRACT

An electrically erasable programmable read only memory (EEPROM) cell structure and a method of fabricating the same. The EEPROM cell comprising a substrate comprising two shallow trench isolation (STI) structures separated by a substrate portion; an intermediate patterned layer formed on the substrate such that the patterned layer covers respective portions of each STI structure; a floating gate bridging between the STI structures such that the floating gate extends over the intermediate patterned layer; a dielectric layer formed over the floating gate; and a control gate formed over the dielectric layer.

8 Claims, 3 Drawing Sheets

EEPROM CELL STRUCTURE AND A METHOD OF FABRICATING THE SAME

FIELD OF INVENTION

The invention broadly relates to an EEPROM cell structure and a method of fabricating the same.

BACKGROUND

Electrically erasable programmable read only memory (EEPROM) are non volatile memory devices which use floating gate metal oxide semiconductor technology to store data. Each EEPROM cell contains a floating gate MOS transistor. A logical state is written into the EEPROM cell by providing a required voltage between the substrate, source, gate and drain of the floating gate MOS transistor in order to cause tunneling (Fowler-Nordheim tunnelling) of electrons from the substrate through the floating gate insulator (sometimes known as the tunnel oxide) onto the floating gate. The other logical state is written by providing specific voltages between the source, gate and drain which discharge electrons from the floating gate of the EEPROM cell by tunneling electrons through the floating gate insulator layer from the floating gate to the substrate.

FIGS. 1(a)-(d) are schematic cross-sectional diagrams illustrating the fabrication process of a typical prior art EEPROM cell. In FIG. 1(a), a shallow trench isolation (STI) structure 104 is formed within a silicon substrate using any suitable process known in the art. Each of the 2 parts of the STI structure 104 are separated by a substrate portion 102. A polysilicon (Poly 1) layer (not shown) that is disposed above the substrate portion 102 and STI structure 104 is completely etched. The Poly 1 layer is typically used to form the logic device poly gate, which is located at the logic circuit area. In FIG. 1(b), a tunnel oxide layer 106, usually comprising silicon dioxide, is grown on the substrate portion 102 and STI structure 104. In FIG. 1(c), a layer of polysilicon 108 is deposited above the tunnel oxide layer 106. In FIG. 1(d), the tunnel oxide layer 106 and polysilicon layer 108 are etched through suitable photolithography and etching processes. The layer of polysilicon 108 functions as a polysilicon floating gate (FG). The polysilicon floating gate 108 conforms to the topology of the underlying tunnel oxide layer 110, substrate portion 102 and STI structure 104. In FIG. 1(e), a dielectric layer 114 is deposited above the polysilicon floating gate 108. The dielectric layer 114 is typically made of a Oxide/Nitride/Oxide (ONO) sandwich and is deposited above the polysilicon floating gate 108 though any suitable process (e.g. low pressure chemical vapour deposition (LPCVD)). A control gate (CG) layer 116 is in turn deposited on the dielectric layer 114. The combined polysilicon floating gate 108, dielectric layer 114 and control gate layer 116 forms the EEPROM's capacitive structure. The capacitive structure is able to store charges and of the presence/absence of a charge determines the value (1 or 0) of the EEPROM cell.

In current EEPROM cells, especially those with a low couple ratio, due to the relatively smaller area of overlap between the floating gate and the control gate (resulting in a lower capacitance within the EEPROM cell) there is usually a need to generate a relatively high voltage to program the EEPROM cell. Herein, couple ratio is defined as the ratio of the capacitance of FG/CG to the total capacitance of the FG surrounding area. For simplicity, the couple ratio can be taken to be approximately equal to the capacitance of FG/CG to the sum of the FG/CG capacitance and the FG/Silicon substrate capacitance, as the remaining area contributes a relatively small portion of the capacitance due to relatively thick dielectric thickness (e.g. STI thickness>>Tunnel oxide or ONO dielectric oxide)

A need therefore exists to provide an EEPROM cell structure and a method of fabricating the same that seeks to address at least one of the above-mentioned problems.

SUMMARY

According to the first aspect of the present invention, there is provided an electrically erasable programmable read only memory (EEPROM) cell comprising: a substrate comprising two shallow trench isolation (STI) structures separated by a substrate portion; an intermediate patterned layer formed on the substrate such that the patterned layer covers respective portions of each STI structure; a floating gate bridging between the STI structures such that the floating gate extends over the intermediate patterned layer; a dielectric layer formed over the floating gate; and a control gate formed over the dielectric layer.

The EEPROM cell may further comprise a tunnel oxide layer formed between the respective portions of each STI structure and the substrate portion on the one hand, and the floating gate.

The intermediate patterned layer may comprise poly silicon.

The floating gate may comprise poly silicon.

The control gate may comprise poly silicon.

According to the second aspect of the present invention, there is provided a method of fabricating an electrically erasable programmable read only memory (EEPROM) cell, the method comprising the steps of: forming, on a substrate, two shallow trench isolation (STI) structures separated by a substrate portion; forming an intermediate patterned layer on the substrate such that the patterned layer covers respective portions of each STI structure; forming a floating gate over the intermediate patterned layer such that the floating gate bridges the STI structures; forming a dielectric layer over the floating gate; and forming a control gate over the dielectric layer.

The method may further comprise the step of forming a tunnel oxide layer between the respective portions of each STI structure and the substrate portion on the one hand, and the floating gate.

The intermediate patterned layer may comprise poly silicon.

The floating gate may comprise poly silicon.

The control gate may comprise poly silicon.

BRIEF DESCRIPTION OF THE DRAWINGS

Example embodiments of the invention will be better understood and readily apparent to one of ordinary skill in the art from the following written description, by way of example only, and in conjunction with the drawings, in which.

DETAILED DESCRIPTION

In general, capacitance (C) is related to charge (Q) and voltage (V) by the formula:

$$C = \frac{Q}{V} \quad (1)$$

Therefore, for a certain amount of charge (Q), the capacitance is inversely proportional to voltage (V). Accordingly, to advantageously reduce the voltage (V) required to program an EEPROM cell, one can increase the capacitance (C).

The general formula for capacitance (C) is:

$$C = \varepsilon_r \varepsilon_o \frac{A}{d} \quad (2)$$

where A is the area of overlap of the two charge plates, $\varepsilon_r$ is the dielectric constant of the material between the plates, $\varepsilon_o$ is a constant ($8.854 \times 10^{-12}$ Fm$^{-1}$), and d is the separation between the plates.

An EEPROM comprises a capacitive structure comprising a floating gate, a dielectric and a control gate. The dielectric is sandwiched between the floating gate, and the control gate. Therefore, by increasing the area between the floating gate and the control gate, while keeping the thickness of the dielectric constant (i.e. the separation between the floating gate and the control gate), the capacitance (C) of the capacitive structure can be increased. In turn, the voltage (V) required to program an EEPROM cell is advantageously reduced.

Figure 2:
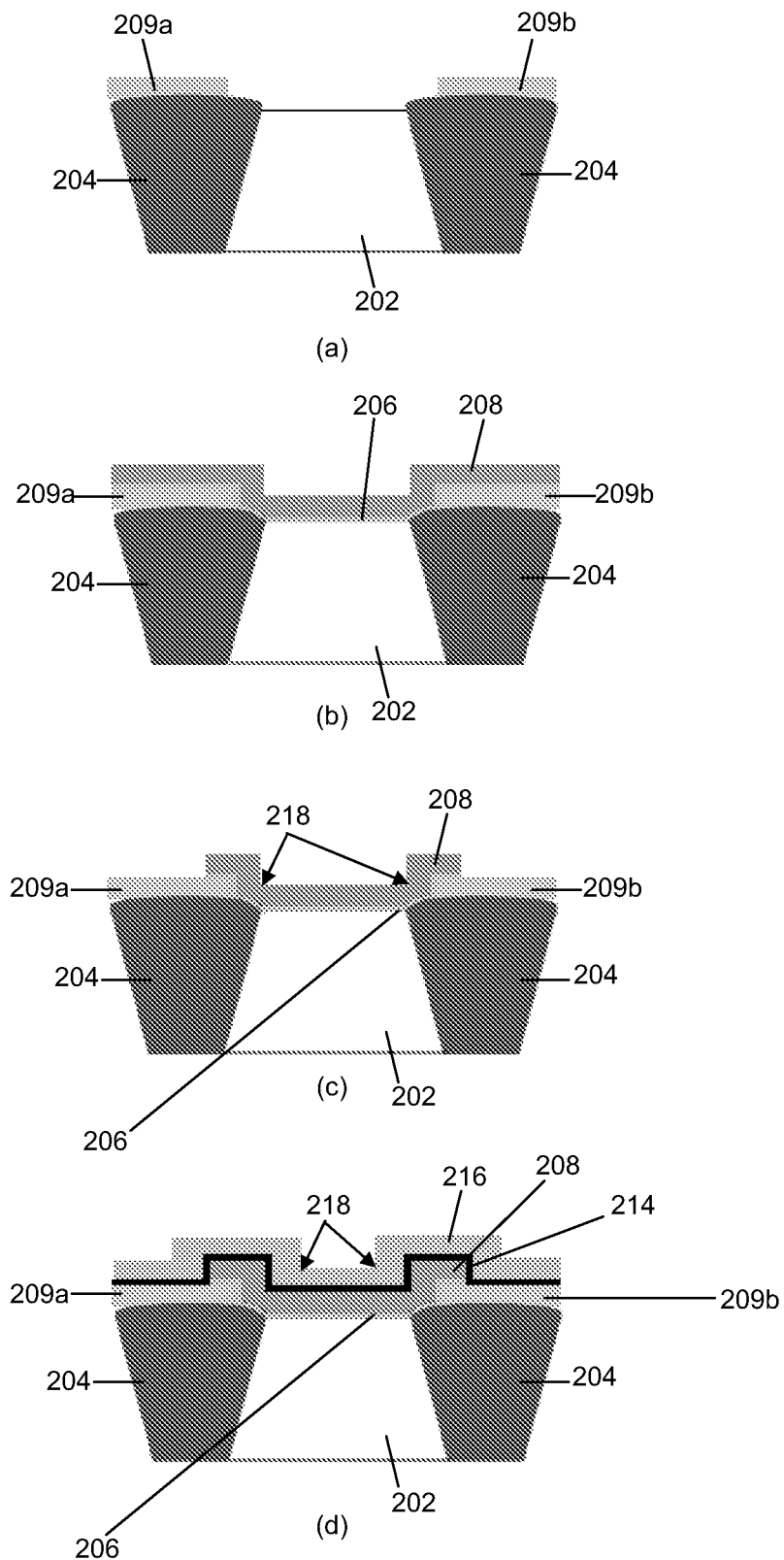
FIGS. 2(a)-(d) are schematic cross-sectional diagrams illustrating the fabrication process of an EEPROM cell, according to an embodiment of the present invention.

FIGS. 2(a)-(d) are schematic cross-sectional diagrams illustrating the fabrication process of an EEPROM cell, according to an embodiment of the present invention. In FIG. 2(a), a shallow trench isolation (STI) structure 204 is formed within a silicon substrate using any suitable process known in the art. Each of the 2 parts of the STI structure 204 are separated by a substrate portion 202. An intermediate polysilicon (Poly 1) layer is deposited on the substrate portion 202 and STI structure 204. The intermediate Poly 1 layer is selectively etched away through suitable photolithography (e.g. Tunnel of Mask (TOM)) and etching processes to form a discontinuous intermediate patterned layer of polysilicon 209a/b on the STI structure 204. The TOM is used to define the area on which the tunnel oxide is subsequently grown.

In FIG. 2(b), a tunnel oxide layer 206, is grown above the substrate portion 202, the discontinuous layer of polysilicon 209a/b, and STI structure 204. A layer of polysilicon 208 is deposited above the tunnel oxide layer 206. The layer of polysilicon 208 functions as a polysilicon floating gate.

In FIG. 2(c), the layer of polysilicon 208 and tunnel oxide layer 206 are selectively etched away through suitable photolithography and etching processes. Due to the discontinuous layer of polysilicon 209a/b, the polysilicon floating gate 208 and tunnel oxide layer 206 conform to the topology of the underlying layers to form a "step" feature 218. The "step" 218 is preferably about 0.2 μm (for 0.18 μm technology node). The floating gate 208 bridges each of the two parts of the STI structure 204 such that the floating gate 208 extends over the intermediate patterned layer of polysilicon 209a/b.

In FIG. 2(d), a dielectric layer 214 is deposited above the polysilicon floating gate 208. The dielectric layer 214 is typically made of a Oxide/Nitride/Oxide (ONO) sandwich and is deposited above the polysilicon floating gate 208 though any suitable process (e.g. low pressure chemical vapour deposition (LPCVD)). The dielectric layer is preferably about 200 Å. A control gate layer 216 is in turn deposited on the dielectric layer 214. Both the dielectric layer 214 and control gate layer 216 also conform to the topology of the underlying layers (i.e. the floating gate 208, tunnel oxide layer 206 and discontinuous layer of polysilicon 209a/b) to further define the "step" feature 218. The combined polysilicon floating gate 208, dielectric layer 214 and control gate layer 216 forms the EEPROM's capacitive structure.

Figure 1:
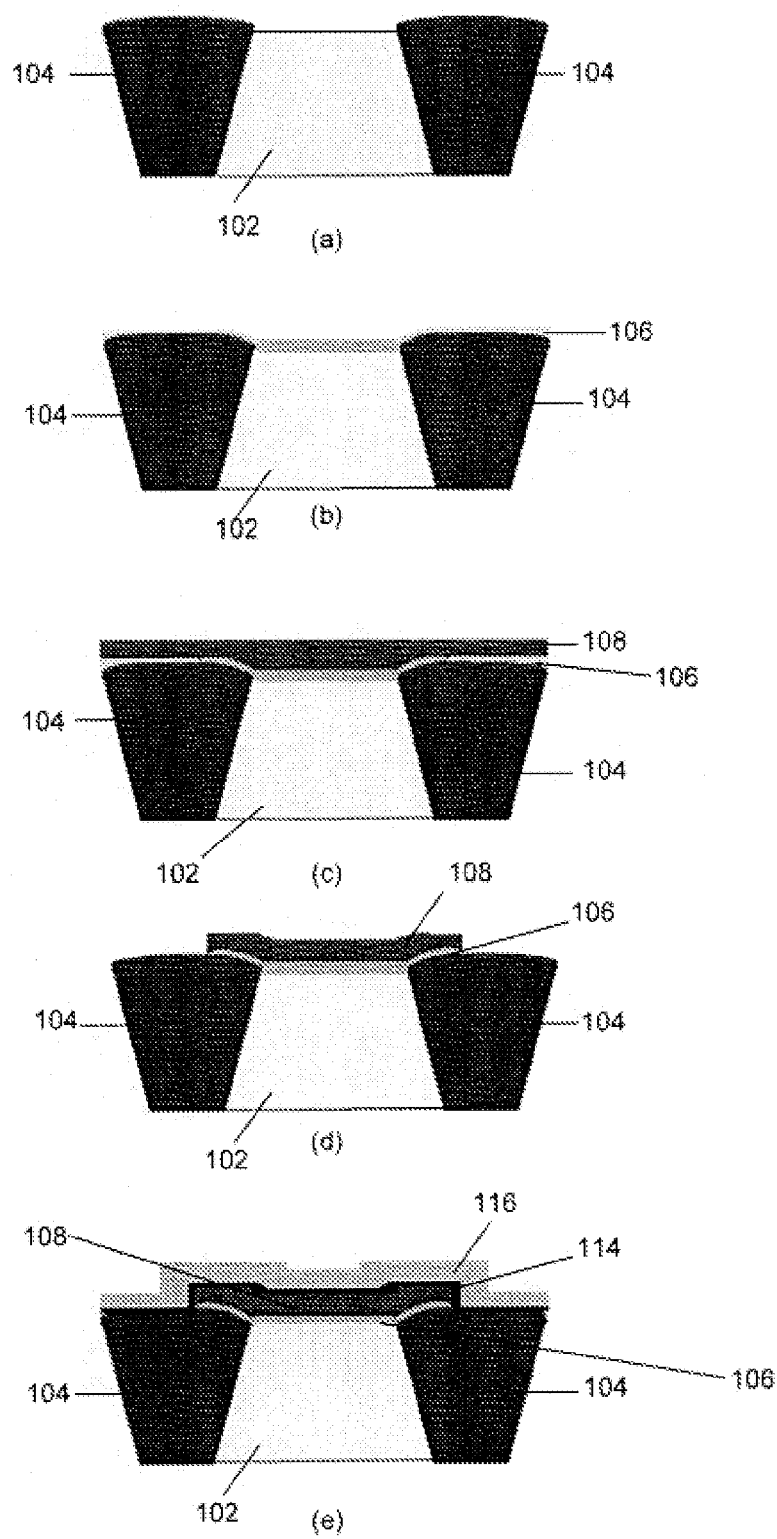
FIGS. 1(a)-(e) are schematic cross-sectional diagrams illustrating the fabrication process of a typical prior art EEPROM cell.

With reference to FIGS. 2(c) and (d), and in contrast to FIGS. 1(c) and (d), the "step" feature 218 in the present embodiment advantageously increases the overlapping surface area between the floating gate and the control gate. This increase in overlapping surface area results in an increase in capacitance between the floating gate and the control gate such that the voltage required to program an EEPROM cell is advantageously lowered.

In addition, the fabrication process described above is compatible with the current EEPROM process as the main modification involves a suitable mask to selectively etch the polysilicon (Poly 1) layer that is disposed above the STI structure. The remaining discontinuous layer of polysilicon facilitates the formation of a "step" feature for the overlying capacitive structure.

Figure 3:
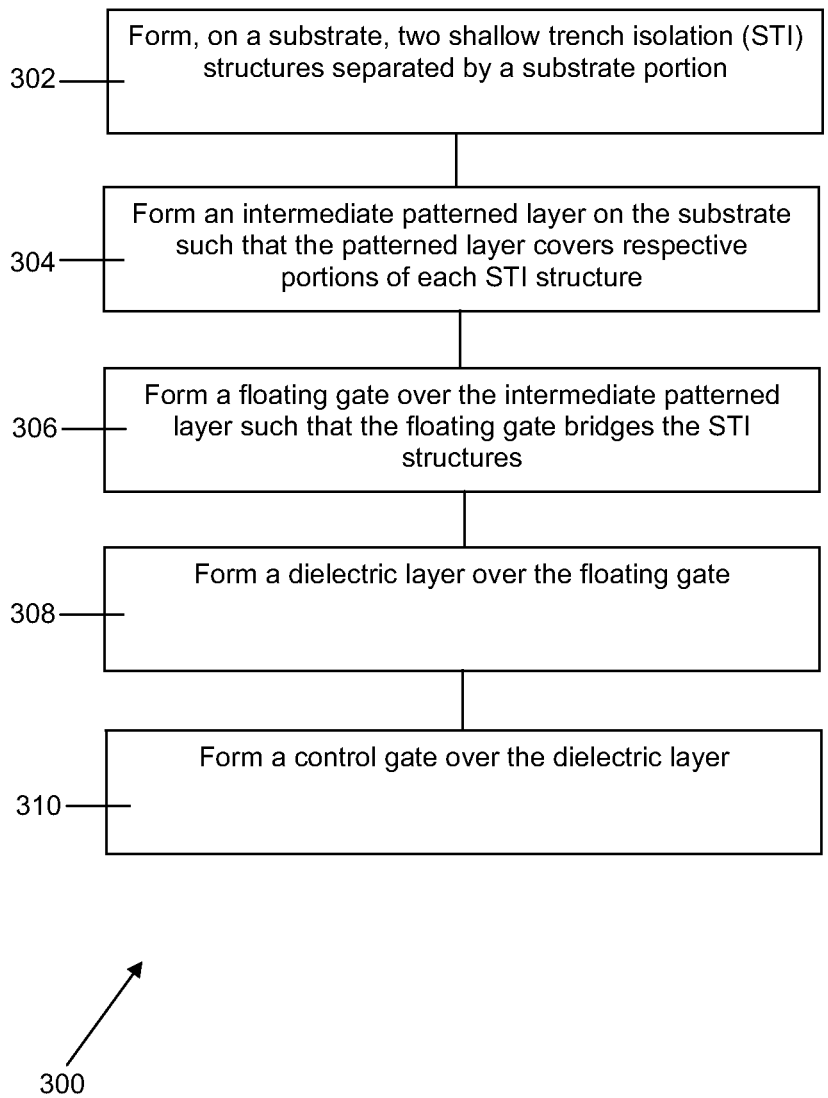
FIG. 3 is a flow chart illustrating a method of fabricating an electrically erasable programmable read only memory (EEPROM) cell, according to an embodiment of the present invention.

FIG. 3 is a flow chart, designated generally as reference numeral 300, illustrating a method of fabricating an electrically erasable programmable read only memory (EEPROM) cell, according to an embodiment of the present invention. At step 302, two shallow trench isolation (STI) structures separated by a substrate portion are formed on a substrate. At step 304, an intermediate patterned layer is formed on the substrate such that the patterned layer covers respective portions of each STI structure. At step 306, a floating gate is formed over the intermediate patterned layer such that the floating gate bridges the STI structures. At step 308, a dielectric layer is formed over the floating gate. At step 310, a control gate is formed over the dielectric layer.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

The invention claimed is:

1. An electrically erasable programmable read only memory (EEPROM) cell comprising:
    a substrate comprising two shallow trench isolation (STI) structures separated by a substrate portion;
    an intermediate patterned layer formed on the substrate such that the patterned layer covers respective portions of each STI structure, the intermediate patterned layer comprising poly silicon;
    a floating gate bridging between the STI structures such that the floating gate extends over the intermediate patterned layer;
    a dielectric layer formed over the floating gate; and
    a control gate formed over the dielectric layer.

2. The EEPROM cell as claimed in claim 1, further comprising a tunnel oxide layer formed between the respective portions of each STI structure and the substrate portion on the one hand, and the floating gate.

3. The EEPROM cell as claimed in claim 1, wherein the floating gate comprises poly silicon.

4. The EEPROM cell as claimed in claim 1, wherein the control gate comprises poly silicon.

5. A method of fabricating an electrically erasable programmable read only memory (EEPROM) cell, the method comprising:
- forming, on a substrate, two shallow trench isolation (STI) structures separated by a substrate portion;
- forming an intermediate patterned layer on the substrate such that the patterned layer covers respective portions of each STI structure, the intermediate patterned layer comprising poly silicon;
- forming a floating gate over the intermediate patterned layer such that the floating gate bridges the STI structures;
- forming a dielectric layer over the floating gate; and
- forming a control gate over the dielectric layer.

6. The method as claimed in claim 5, further comprising forming a tunnel oxide layer between the respective portions of each STI structure and the substrate portion on the one hand, and the floating gate.

7. The method as claimed in claim 5, wherein the floating gate comprises poly silicon.

8. The method as claimed in claim 5, wherein the control gate comprises poly silicon.

\* \* \* \* \*